(12) United States Patent
Takai

(10) Patent No.: US 7,663,364 B2
(45) Date of Patent: Feb. 16, 2010

(54) MAGNETIC RESONANCE IMAGING APPARATUS, IMAGE PROCESSING APPARATUS, COMPUTER PROGRAM PRODUCT, AND DATA STORING METHOD

(75) Inventor: Hiroshi Takai, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 179 days.

(21) Appl. No.: 12/068,163

(22) Filed: Feb. 4, 2008

(65) Prior Publication Data

US 2008/0187203 A1    Aug. 7, 2008

(30) Foreign Application Priority Data

Feb. 6, 2007  (JP) ............................. 2007-026756
Oct. 29, 2007 (JP) ............................. 2007-280656

(51) Int. Cl.
*G01V 3/00* (2006.01)
(52) U.S. Cl. ...................................... 324/307; 324/309
(58) Field of Classification Search ......... 324/300–322; 600/407–445; 378/4, 8, 15, 901
See application file for complete search history.

(56) References Cited

U.S. PATENT DOCUMENTS 6,965,232 B2 * 11/2005 Sodickson .................. 324/307
7,372,269 B2 *  5/2008 Takizawa et al. ............ 324/309

FOREIGN PATENT DOCUMENTS

| JP | 4-285532    | 10/1992 |
| JP | 5-277098    | 10/1993 |
| JP | 2002-000581 | 1/2002  |
| JP | 2002-034950 | 2/2002  |
| JP | 2003-144411 | 5/2003  |

\* cited by examiner

*Primary Examiner*—Brij B Shrivastav
(74) *Attorney, Agent, or Firm*—Nixon & Vanderhye, PC (57) ABSTRACT

A sequence control unit reconstructs image data by performing predetermined image reconstruction including data synthesis processing on a plurality of k-space data collected for each receiver channel. An inverse reconstructing unit creates k-space data synthesized from the K-space data by performing predetermined inverse reconstruction on the reconstructed image data. A data compressing unit compresses the k-space data, and stores the compressed k-space data into a k-space data storing unit.

25 Claims, 9 Drawing Sheets

MAGNETIC RESONANCE IMAGING APPARATUS, IMAGE PROCESSING APPARATUS, COMPUTER PROGRAM PRODUCT, AND DATA STORING METHOD

CROSS-REFERENCE TO RELATED APPLICATIONS

This application is based upon and claims the benefit of priority from the prior Japanese Patent Application No. 2007-026756, filed on Feb. 6, 2007 and the prior Japanese Patent Application No. 2007-280656, filed on Oct. 29, 2007; the entire contents of which are incorporated herein by reference.

BACKGROUND OF THE INVENTION

1. Field of the Invention

The present invention relates to a magnetic resonance imaging (MRI) apparatus that takes an internal image of an object using magnetic resonance phenomenon, an image processing apparatus, a computer program product, and a data storing method for the MRI apparatus.

2. Description of the Related Art

Recently, as the development of parallel imaging has proceeded, a magnetic resonance imaging apparatus has become able to take an image of a wide scope at a high resolution in a short time and with a favorable signal-to-noise (SN) ratio. The parallel imaging is a technology of creating an image of a required area by dividing an area of an object into a plurality of areas, simultaneously scanning the divided areas, and synthesizing a plurality of images obtained as a result of the scanning.

The parallel imaging uses a plurality of receiver coils to scan a plurality of areas simultaneously, and the number of receiver coils trends upward to reduce time for scanning. As the receiver coils are increased, the number of channels to be received increases proportionately, and a data volume of k-space data to be collected also increases in proportion to the number of the channels. Consequently, a required capacity of a storage medium (for example, a hard disk) for storing therein the collected k-space data increases day by day.

For this reason, a technology has been proposed for reducing a required capacity of a storage medium for storing therein data by compressing collected data. For example, according to a data compression method disclosed in JP-A 2002-34950 (KOKAI), focusing on a fact that the absolute value of a change volume in individual values of data continuously collected from an object is smaller than the absolute value of a value set in each piece of the data, a difference from reference data to each collected data (difference between the values) is calculated, the bit length is reduced by deleting several upper bits in difference data obtained as a result of the calculation, the bit-length reduced data is stored into a storage medium instead of the actually collected data, accordingly a required capacity of the storage medium is reduced.

However, according to the above conventional technology, a difference from the reference data needs to be calculated with respect to each of collected data piece by piece, which is very inefficient. Therefore, if the technology is applied to a large volume of data, such as k-space data, it may cause a problem that it takes a long time for storing data into a medium.

SUMMARY OF THE INVENTION

According to an aspect of the present invention, there is provided a magnetic resonance imaging apparatus including a data collecting unit that collects a plurality of first k-space data from an object by using nuclear magnetic resonance phenomenon; an image reconstructing unit that reconstructs image data by performing a predetermined image reconstruction process including a data synthesizing process on the first k-space data collected by the data collecting unit; an inverse reconstructing unit that creates second k-space data synthesized from the first k-space data by performing a predetermined inverse reconstruction process on the image data reconstructed by the image reconstructing unit; and a converted-data storing unit that stores the second k-space data created by the inverse reconstructing unit into a storage medium.

Furthermore, according to another aspect of the present invention, there is provided a magnetic resonance imaging apparatus including a data collecting unit that collects a plurality of first k-space data from an object by using nuclear magnetic resonance phenomenon; a bit-length reducing unit that reduces a bit length of each of the first k-space data collected by the data collecting unit, and outputs second k-space data with a reduced bit length; and a converted-data storing unit that stores the second k-space data into a storage medium.

Moreover, according to still another aspect of the present invention, there is provided an image processing apparatus including a data acquiring unit that acquires a plurality of first k-space data collected from an object by using nuclear magnetic resonance phenomenon; an image reconstructing unit that reconstructs image data by performing a predetermined image reconstruction process including a data synthesizing process on the first k-space data acquired by the data acquiring unit; an inverse reconstructing unit that creates second k-space data synthesized from the first k-space data by performing a predetermined inverse reconstruction process on the image data reconstructed by the image reconstructing unit; and a converted-data storing unit that stores the second k-space data created by the inverse reconstructing unit into a storage medium.

Furthermore, according to still another aspect of the present invention, there is provided a computer program product including a computer-usable medium having computer-readable program codes embodied in the medium that when executed cause a computer to execute acquiring a plurality of first k-space data collected from an object by using nuclear magnetic resonance phenomenon; reconstructing image data by performing a predetermined image reconstruction process including a data synthesizing process on the first k-space data acquired at the acquiring; creating second k-space data synthesized from the first k-space data by performing a predetermined inverse reconstruction process on the image data reconstructed at the reconstructing; and storing the second k-space data created at the creating into a storage medium.

Moreover, according to still another aspect of the present invention, there is provided a method of storing data including acquiring a plurality of first k-space data collected from an object by using nuclear magnetic resonance phenomenon; reconstructing image data by performing a predetermined image reconstruction process including a data synthesizing process on the first k-space data acquired at the acquiring; creating second k-space data synthesized from the first k-space data by performing a predetermined inverse reconstruction process on the image data reconstructed at the reconstructing; and storing the second k-space data created at the creating into a storage medium.

DETAILED DESCRIPTION OF THE INVENTION

Exemplary embodiments of the present invention will be explained in detail below with reference to the accompanying drawings.

A concept of storing data by a magnetic resonance imaging (MRI) apparatus according to a first embodiment of the present invention is explained below. The MRI apparatus explained herein is configured to collect k-space data by using multichannel coils, to reconstruct image data by parallel imaging, and to store the k-space data collected from an object into a storage medium (for example, a hard disk) at the same time to the reconstruction of the image data.

Figure 1:
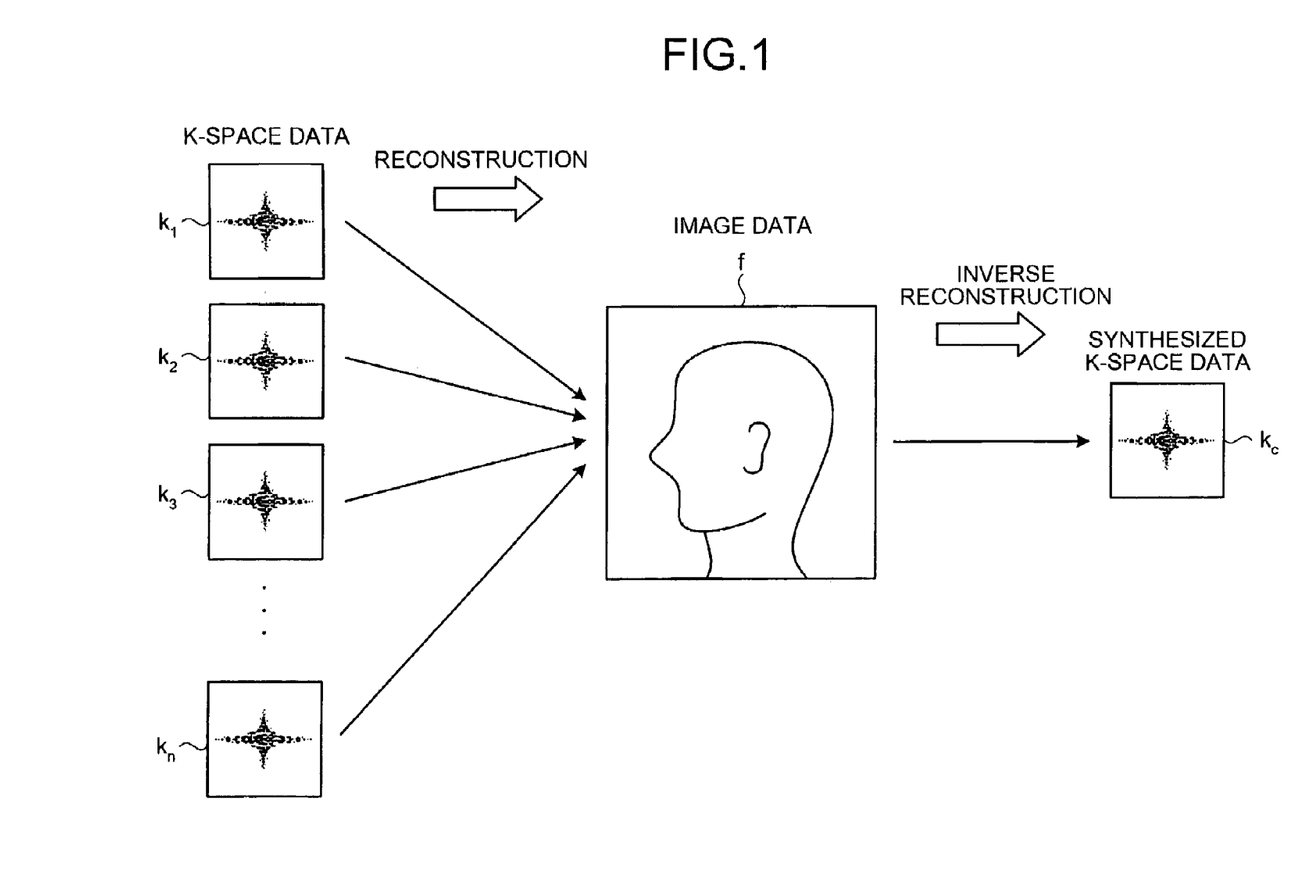
FIG. 1 is a schematic diagram for explaining a concept of storing data by an MRI apparatus according to a first embodiment of the present invention.

As shown in FIG. 1, suppose the MRI apparatus according to the first embodiment collects, for example, k-space data $k_1$ to $k_n$ with respect to n receiver-channels. The MRI apparatus then performs predetermined image reconstruction including data synthesis processing on the n the k-space data $k_1$ to $k_n$, and reconstructs image data f. To reconstruct the image data f from the n the k-space data $k_1$ to $k_n$, specifically, Fourier transformation and various synthesis processing are performed by the MRI apparatus as the predetermined image reconstruction.

After the image data f is reconstructed, the MRI apparatus creates synthetic k-space data $k_c$ synthesized from the n the k-space data $k_1$ to $k_n$ by performing predetermined inverse reconstruction on the image data f. To create the k-space data $k_c$, specifically, inverse Fourier transformation is performed by the MRI apparatus as the predetermined inverse reconstruction.

After the k-space data $k_c$ is created, the MRI apparatus stores the created k-space data $k_c$ into a predetermined storage medium, such as a hard disk.

Comparing to the number of the k-space data $k_1$ to $k_n$ collected from the object is n pieces, which is as many as the number of the receiver channels, the k-space data $k_c$ created by the inverse reconstruction is synthesized into one piece, of which data volume is one n-th, that is very small.

Thus, the MRI apparatus according to the first embodiment aggregates k-space data, so that the MRI apparatus can reduce a required capacity of a storage medium for storing therein the k-space data collected from an object.

Figure 2:
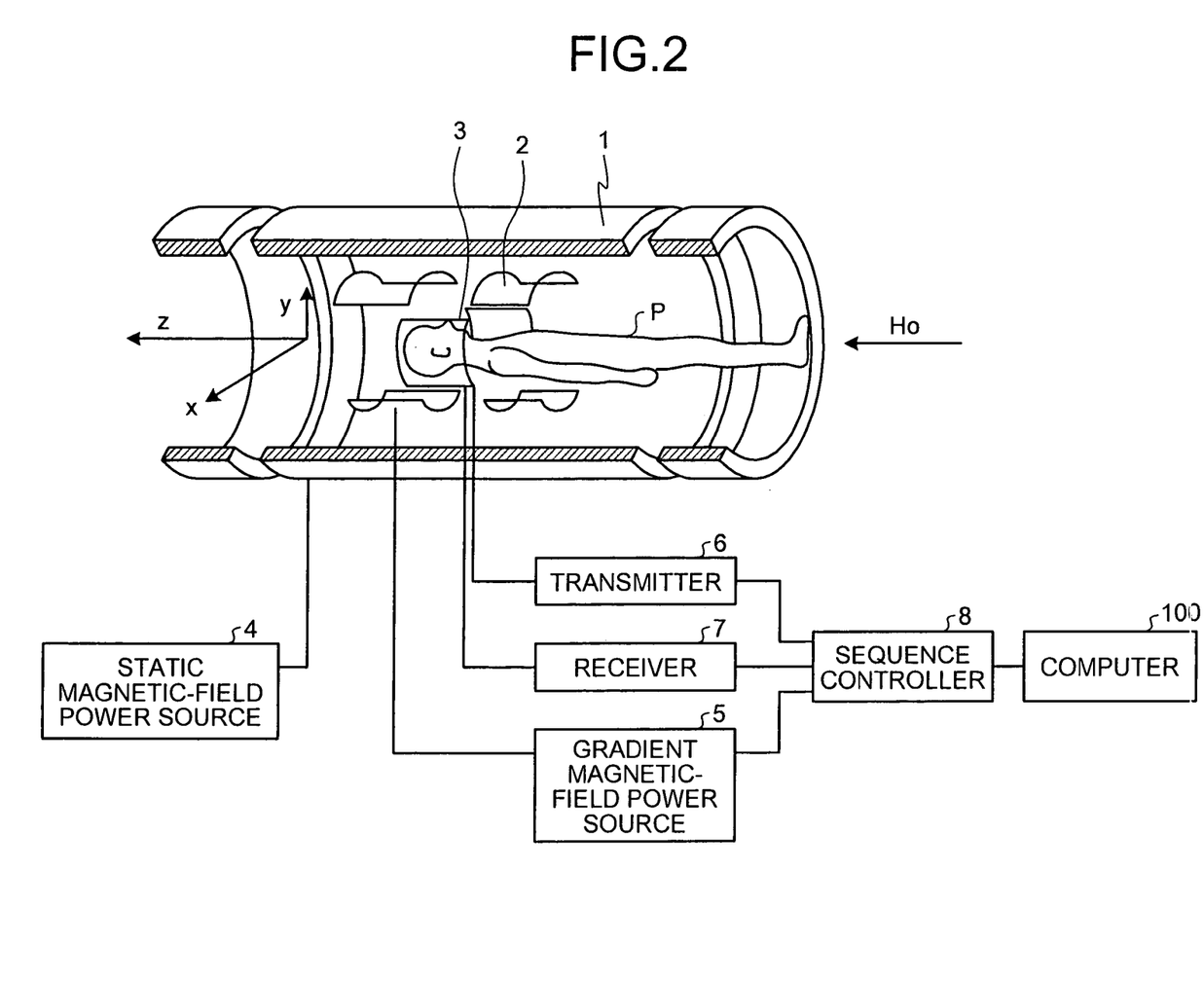
FIG. 2 is a schematic diagram of the MRI apparatus according to the first embodiment.

A configuration of the MRI apparatus according to the first embodiment is explained below. As shown in FIG. 2, the MRI apparatus includes a static magnetic-field magnet 1, a gradient magnetic-field coil 2, a radiofrequency (RF) coil 3, a static magnetic-field power source 4, a gradient magnetic-field power source 5, a transmitter 6, a receiver 7, a sequence controller 8, and a computer 100.

The static magnetic-field magnet 1 is a magnet formed in a cylindrical shape, and generates a static magnetic field Ho in a space inside a cylinder in which the object P is placed using a current supplied from the static magnetic-field power source 4. The gradient magnetic-field coil 2 is three pairs of coils arranged inside the static magnetic-field magnet 1, and generates a gradient magnetic field inside the static magnetic-field magnet 1 along three directions of the x, y, and z-axes using a current supplied from the gradient magnetic-field power source 5.

The RF coil 3 is a multichannel coil arranged to be opposed to the object P inside the opening of the static magnetic-field magnet 1, irradiates the object P with an RF wave sent from the transmitter 6, and receives a magnetic resonance (MR) signal emitted from hydrogen nuclei in the object P owing to excitation in multiple channels. Although the RF coil 3 includes a plurality of coils in practice, the coils are not shown in FIG. 2.

The static magnetic-field power source 4 supplies a current to the static magnetic-field magnet 1, and the gradient magnetic-field power source 5 supplies a current to the gradient magnetic-field coil 2 based on an instruction from the sequence controller 8.

The transmitter 6 sends an RF wave to the RF coil 3 based on an instruction from the sequence controller 8, and the receiver 7 detects the MR signal received by the RF coil 3, and creates raw data by digitalizing the MR signal. After creating the raw data from the MR signal, the receiver 7 sends the created raw data to the sequence controller 8.

The sequence controller 8 performs scanning of the object P by activating the gradient magnetic-field power source 5, the transmitter 6, and the receiver 7, based on sequence information sent from the computer 100. The sequence information defines a procedure when scanning, such as the strength of power to be supplied to the gradient magnetic-field coil 2 by the gradient magnetic-field power source 5 and the timing of supplying the power, the strength of an RF wave to be sent to the RF coil 3 by the transmitter 6 and the timing of sending the RF wave, and the timing of detecting the MR signal by the receiver 7.

When raw data is sent from the transmitter 6 as a result of scanning the object P, the sequence controller 8 transfers the raw data to the computer 10.

The computer 100 controls the MRI apparatus based on an instruction from an operator, converts raw data sent from the sequence controller 8 to k-space data, and reconstructs image data from the k-space data.

Figure 3:
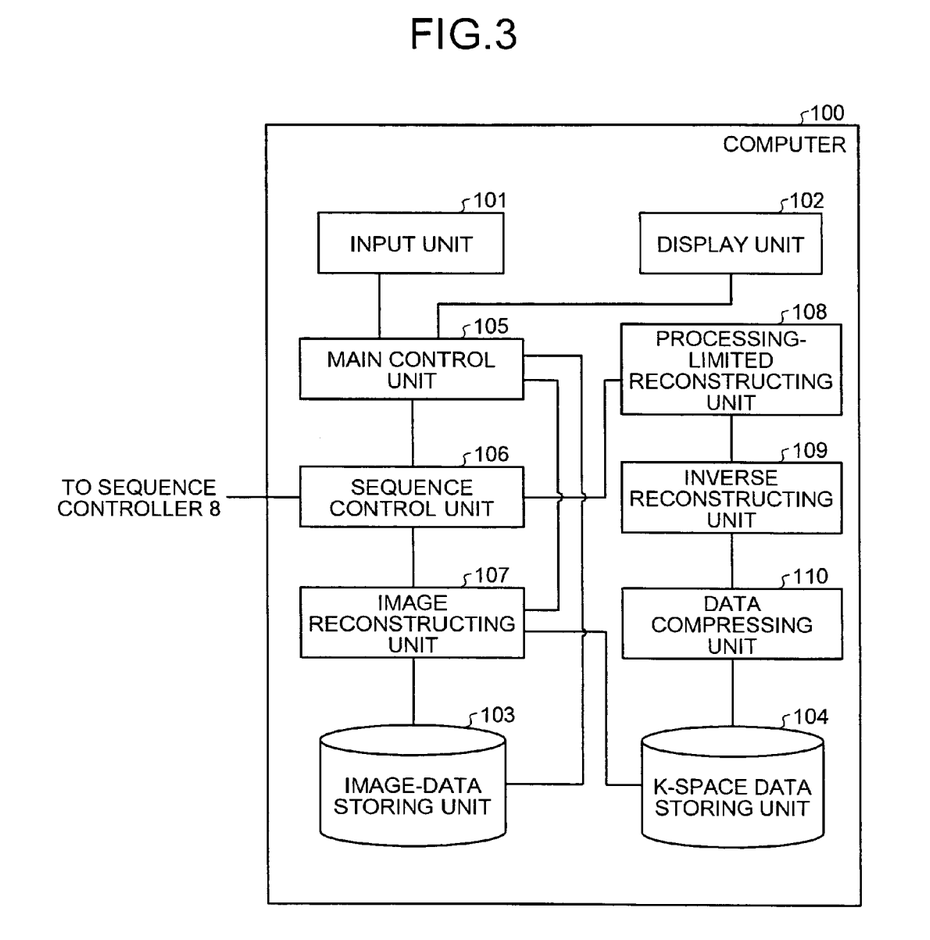
FIG. 3 is a functional block diagram of a computer shown in FIG. 2.

Then, a configuration of a software program to be executed by the computer 100 shown in FIG. 2 is explained below. As shown in FIG. 3, the software program includes conceptual functional units, namely, an input unit 101, a display unit 102, an image-data storing unit 103, a k-space data storing unit 104, a main control unit 105, a sequence control unit 106, an image reconstructing unit 107, a processing-limited reconstructing unit 108, an inverse reconstructing unit 109, and a data compressing unit 110.

The input unit 101 is configured to receive various pieces of information, can be implemented by a pointing device, such as a mouse or a trackball, and a keyboard, and provides a user interface for the operator to input instructions. For example, the input unit 101 receives an instruction about scanning and scanning conditions during the scanning.

The display unit 102 displays thereon various pieces of information, and can be implemented by a cathode ray tube (CRT), a liquid crystal display, or the like. For example, the display unit 102 displays thereon an image reconstructed by the image reconstructing unit 107.

The image-data storing unit 103 stores therein image data reconstructed from k-space data sent from the sequence control unit 106. The k-space data storing unit 104 stores therein compressed image data that is compressed by a predetermined compression method.

The main control unit 105 controls the MRI apparatus by receiving various instructions from the operator via the input unit 101, and controlling operations of functional units based on the received instructions.

Specifically, when receiving scanning conditions from the operator, the main control unit 105 creates sequence information based on the instructed scanning conditions, and sends the created sequence information to the sequence control unit 106. Accordingly, the sequence control unit 106 takes an image in accordance with the scanning conditions instructed by the operator. After taking the image, when image data is sent from the image reconstructing unit 107, the main control unit 105 displays the sent image data onto the display unit 102.

Moreover, when receiving an instruction to display image data from the operator, the main control unit 105 reads the instructed image data from the image-data storing unit 103, and displays the read image data onto the display unit 102.

Furthermore, when the main control unit 105 is instructed by the operator to reconstruct image data, the main control unit 105 controls the image reconstructing unit 107 to reconstruct the instructed image data. When controlling the image reconstructing unit 107, the main control unit 105 notifies the image reconstructing unit 107 of reconstruction requirements specified by the operator. The reconstruction requirements include requirements needed for performing reconstruction or further reconstruction of an image, for example, a condition about the level of a filtering process, and a requirement for the quality of a reconstructed image.

The sequence control unit 106 controls sending and receiving of data to be exchanged between the computer 100 and the sequence controller 8. Specifically, when sequence information is sent from the main control unit 105, the sequence control unit 106 sends the sequence information to the sequence controller 8. Moreover, when raw data is sent from the sequence controller 8, the sequence control unit 106 converts the sent raw data into k-space data, and then sends the converted k-space data to the image reconstructing unit 107 and the processing-limited reconstructing unit 108.

The image reconstructing unit 107 reconstructs image data by performing the predetermined image reconstruction on k-space data sent from the sequence control unit 106. Specifically, when the k-space data is sent from the sequence control unit 106, the image reconstructing unit 107 reconstructs two-dimensional or three-dimensional image data by performing the predetermined image reconstruction on the sent k-space data, including Fourier transformation and data synthesis processing, for example, simultaneous acquisition of spatial harmonics (SMASH), and sensitivity encoding (SENSE). The image reconstructing unit 107 then stores the reconstructed image data into the image-data storing unit 103.

The processing-limited reconstructing unit 108 reconstructs image data by performing image reconstruction on k-space data sent from the sequence control unit 106, excluding a filtering process and an absolutizing process. After reconstructing the image data, the processing-limited reconstructing unit 108 then sends the reconstructed image data to the inverse reconstructing unit 109.

As the processing-limited reconstructing unit 108 performs the image reconstruction except the filtering process and the absolutizing process, the k-space data storing unit 104 stores therein k-space data on which the filtering process and the absolutizing process are not performed. Accordingly, when retrying image reconstruction by changing conditions for performing the filtering process and conditions for performing the absolutizing process, the k-space data stored in the k-space data storing unit 104 can be used, so that this can eliminate time and effort and stress that would arise from re-collecting k-space data from the object otherwise.

The inverse reconstructing unit 109 creates k-space data synthesized from a plurality of k-space data by performing a predetermined inverse reconstruction on image data sent from the processing-limited reconstructing unit 108. Specifically, when image data is sent from the processing-limited reconstructing unit 108, the inverse reconstructing unit 109 creates k-space data from two-dimensional or three-dimensional image data by performing a predetermined inverse reconstruction including inverse Fourier transformation. After the k-space data is created, the inverse reconstructing unit 109 sends the created k-space data to the data compressing unit 110.

The data compressing unit 110 compresses the k-space data sent from the inverse reconstructing unit 109 in accordance with a predetermined compression method, and stores the compressed k-space data into the k-space data storing unit 104. The compression method to be used can be either reversible or irreversible.

As the data compressing unit 110 compresses the k-space data sent from the inverse reconstructing unit 109, a data volume of the k-space data that is already aggregated in a synthesizing process performed by the processing-limited reconstructing unit 108 can be further reduced, so that a required capacity of a storage medium for storing therein k-space data can be further reduced.

Figure 4:
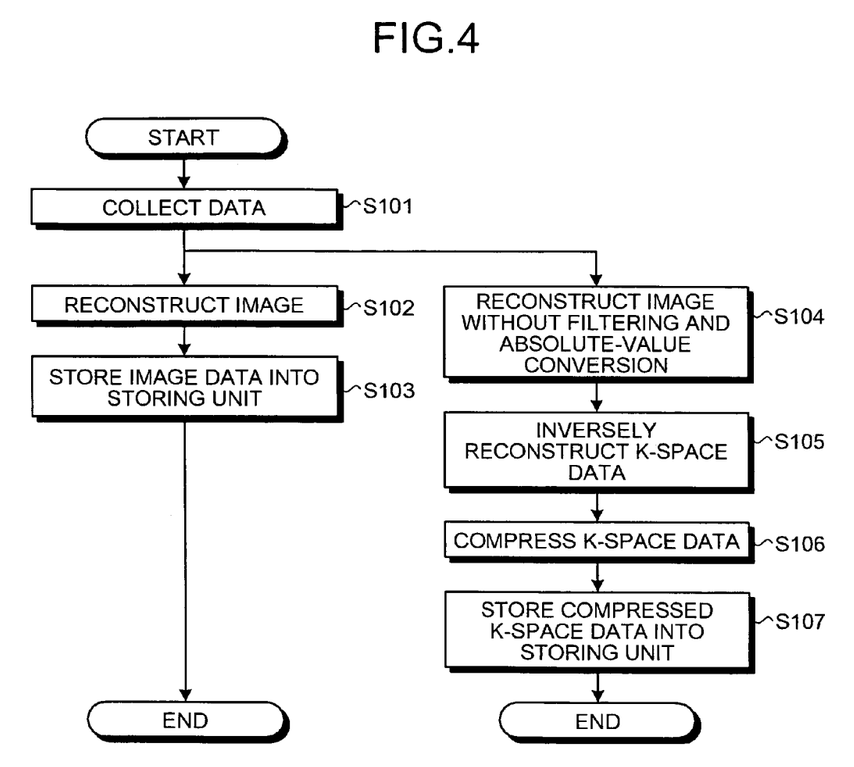
FIG. 4 is a flowchart of a processing procedure performed by the computer shown in FIG. 2.

A processing procedure performed by the computer 100 is explained below. As shown in FIG. 4, to begin with, the computer 100 collects k-space data (Step S101). Specifically, the sequence control unit 106 receives raw data sent from the sequence controller 8, converts the raw data into k-space data, and sends the converted k-space data to the image reconstructing unit 107 and the processing-limited reconstructing unit 108.

When receiving the k-space data, the image reconstructing unit 107 reconstructs image data by performing image reconstruction on the received k-space data (Step S102). The image reconstructing unit 107 then stores the reconstructed image data into the image-data storing unit 103 (Step S103).

On the other hand, when the processing-limited reconstructing unit 108 receives the k-space data, the processing-limited reconstructing unit 108 reconstructs image data by performing image reconstruction except filtering process and absolutizing process on the k-space data (Step S104). The processing-limited reconstructing unit 108 then sends the reconstructed image data to the inverse reconstructing unit 109.

When receiving the reconstructed image data, the inverse reconstructing unit 109 inversely reconstructs k-space data by performing inverse reconstruction on the reconstructed image data (Step S105). The inverse reconstructing unit 109 then sends the inversely-reconstructed k-space data to the data compressing unit 110.

When receiving the k-space data, the data compressing unit 110 compresses the k-space data (Step S106), and stores the compressed k-space data into the k-space data storing unit 104 (Step S107).

As described above, according to the first embodiment, the sequence control unit 106 reconstructs image data by performing the predetermined image reconstruction including data synthesis processing on a plurality of k-space data each of which is collected with respect to each of receiver channels. The inverse reconstructing unit 109 creates synthetic k-space data synthesized from the k-space data by performing the predetermined inverse reconstruction additionally on the reconstructed image data. The data compressing unit 110 then compresses the synthesized k-space data, and stores the compressed k-space data into the k-space data storing unit 104, so that the required capacity of the storage medium for storing therein the k-space data collected from the object can be reduced.

The first embodiment has been explained above in the case where the image reconstruction and the inverse reconstruction are performed on all the k-space data collected from the object. However, if the image reconstruction is to be again performed afterwards by changing some of the conditions, it would be better that the k-space data is not compressed. A second embodiment according to the present invention is explained below in a case where the operator can specify data unneeded to be compressed.

A magnetic resonance imaging apparatus according to the second embodiment has the almost same configuration in total as that of the first embodiment, and only some of functional units included in a computer 200 according to the second embodiment are different from the computer 100. A configuration of a software program and operations to be executed by the computer 200 are explained below.

First of all, a configuration of a software program to be executed by the computer 200 is explained below.

Figure 5:
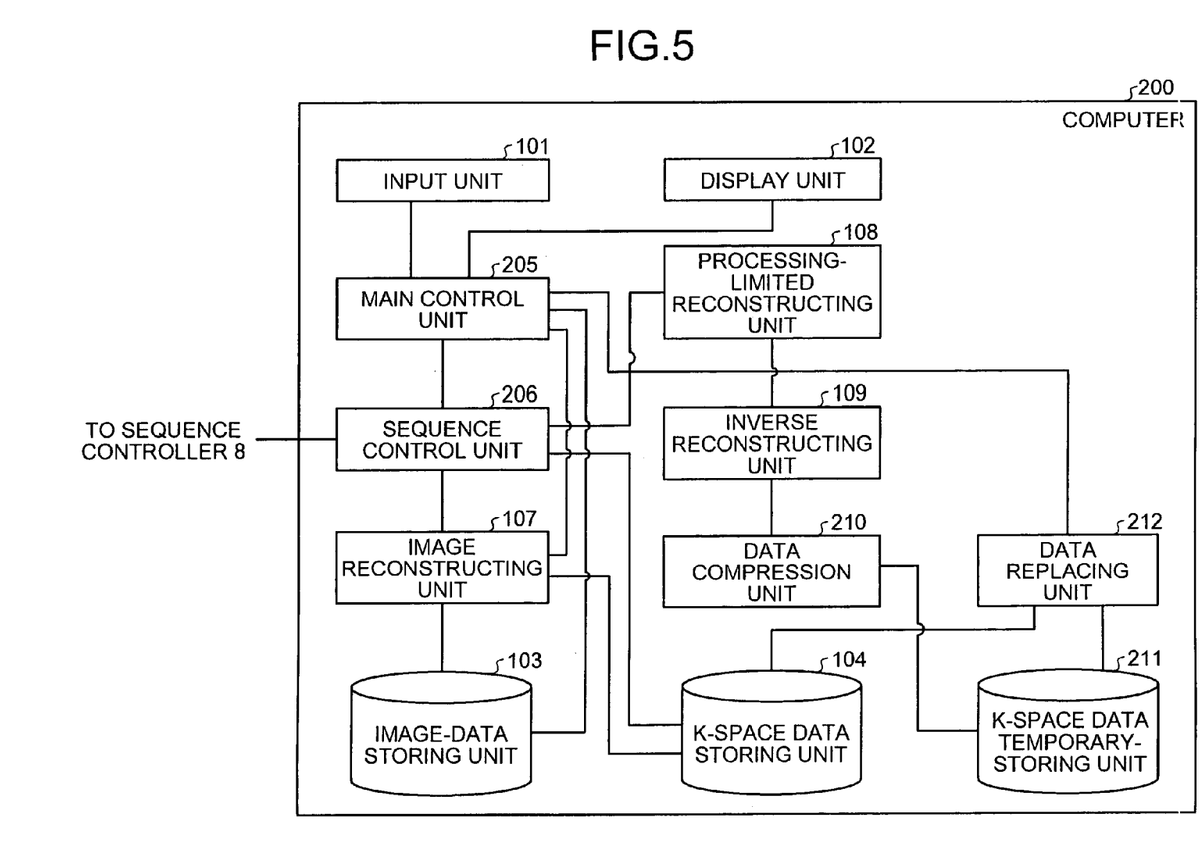
FIG. 5 is a functional block diagram of a computer according to a second embodiment of the present invention.

As shown in FIG. 5, the software program includes conceptual functional units, namely, the input unit 101, the display unit 102, the image-data storing unit 103, the k-space data storing unit 104, a main control unit 205, a sequence control unit 206, the image reconstructing unit 107, the processing-limited reconstructing unit 108, the inverse reconstructing unit 109, a data compressing unit 210, a data replacing unit 212, and a k-space data temporary-storing unit 211.

For convenience of explanation, functional units that works similarly to respective units shown in FIG. 3 are assigned with the same reference numerals, detailed explanations of them are omitted, and only points different from the first embodiment are explained below.

When raw data is sent from the sequence controller 8, the sequence control unit 206 converts the sent raw data into k-space data, sends the converted k-space data to the image reconstructing unit 107 and the processing-limited reconstructing unit 108, and furthermore, stores the converted k-space data into the k-space data storing unit 104.

The data compressing unit 210 compresses k-space data sent from the inverse reconstructing unit 109 in accordance with a predetermined compression method, and stores the compressed data into the k-space data temporary-storing unit 211 instead of the k-space data storing unit 104. The k-space data temporary-storing unit 211 stores therein compressed k-space data that is compressed by the data compressing unit 210.

The main control unit 205 further receives from the operator an instruction to specify image data unneeded to be compressed from among image data reconstructed based on a plurality of k-space data. When the main control unit 205 receives an instruction not to compress the image data while displaying the image data onto the display unit 102, the main control unit 205 stores information to identify the image data into an internal memory.

Furthermore, the main control unit 205 receives from the operator an examination termination instruction that notifies that the examination is finished. When receiving the examination termination instruction, the main control unit 205 instructs the data replacing unit 212 to replace data, and notifies the data replacing unit 212 of identification information about the image data stored in the internal memory at the moment.

The data replacing unit 212 replaces a piece of k-space data that is not specified by the operator as unneeded to be compressed among k-space data stored in the k-space data storing unit 104 with a piece of synthesized k-space data.

Specifically, when receiving an instruction to replace data from the main control unit 205, the data replacing unit 212 refers to identification information about an image notified along with the instruction, and replaces k-space data stored in the k-space data storing unit 104 except k-space data including the identification information to be a basis of image data with compressed k-space data stored in the k-space data temporary-storing unit 211.

Figure 6:
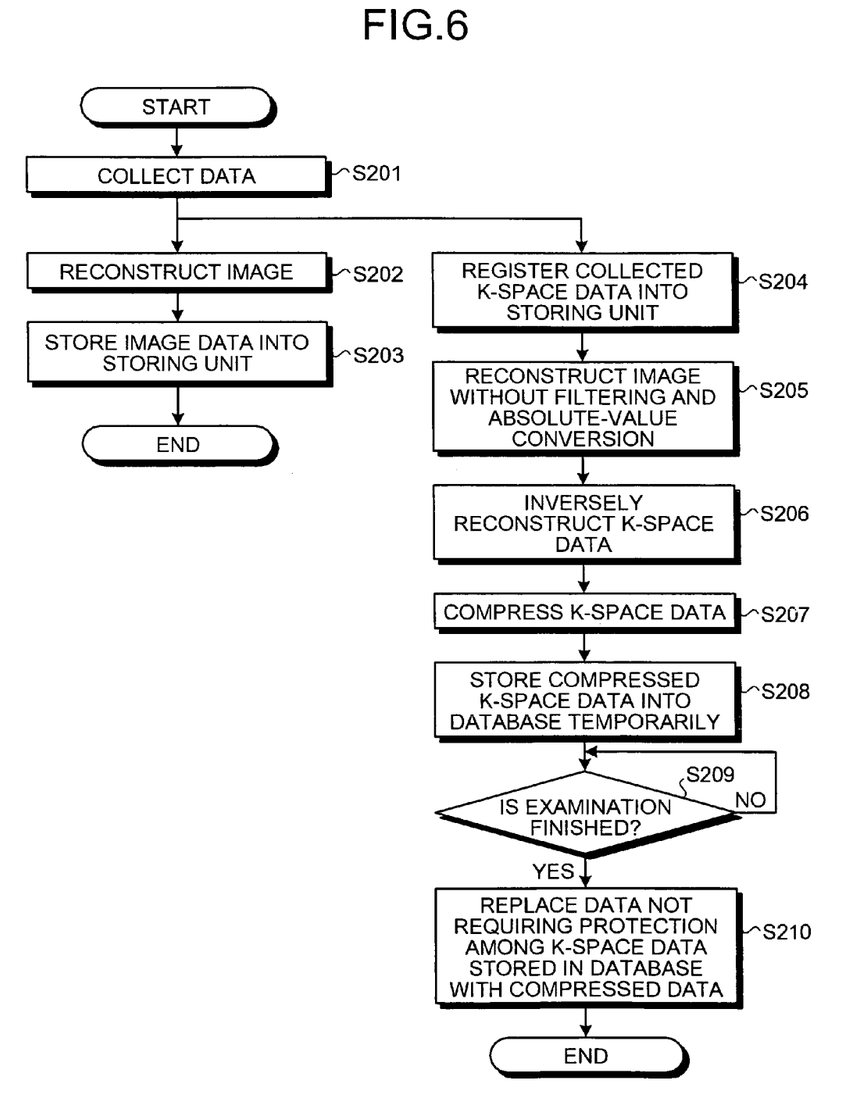
FIG. 6 is a flowchart of a processing procedure performed by the computer according to the second embodiment.

A processing procedure performed by the computer 200 is explained below. As shown in FIG. 6, to begin with, the computer 200 collects k-space data (Step S201). Specifically, the sequence control unit 206 receives raw data sent from the sequence controller 8, converts the raw data into k-space data, and sends the converted k-space data to the image reconstructing unit 107 and the processing-limited reconstructing unit 108.

The sequence control unit 206 then stores the converted k-space data into the k-space data storing unit 104 (Step S204).

When receiving the k-space data, the image reconstructing unit 107 reconstructs image data by performing image reconstruction on the k-space data (Step S202). The image reconstructing unit 107 then stores the reconstructed image data into the image-data storing unit 103 (Step S203).

On the other hand, when the processing-limited reconstructing unit 108 receives the k-space data, the processing-limited reconstructing unit 108 reconstructs image data by performing image reconstruction except filtering process and absolutizing process on the k-space data (Step S205). The processing-limited reconstructing unit 108 then sends the reconstructed image data to the inverse reconstructing unit 109.

When receiving the reconstructed image data, the inverse reconstructing unit 109 inversely reconstructs k-space data by performing inverse reconstruction on the reconstructed image data (Step S206). The inverse reconstructing unit 109 then sends the inversely-reconstructed k-space data to the data compressing unit 210.

When receiving the k-space data, the data compressing unit 210 compresses the k-space data (Step S207), and stores the compressed k-space data into the k-space data temporary-storing unit 211 (Step S208).

The main control unit 205 then receives an instruction to eliminate the examination from the operator (Yes at Step S209), the data replacing unit 212 replaces k-space data stored in the k-space data storing unit 104 except k-space data specified by the operator as unneeded to be compressed with compressed k-space data stored in the k-space data temporary-storing unit 211 (Step S210).

Thus, according to the second embodiment, the operator can specify whether to compress k-space data in accordance with use of the k-space data afterwards.

Although the first and second embodiments are explained above in the case where a data volume of k-space data to be stored in a storage medium is reduced by performing image reconstruction and inverse reconstruction on collected k-space data, the data volume of k-space data can be reduced by reducing the bit length of k-space data, for example.

When an image is reconstructed from k-space data of which bit length is reduced, the quality of the image is degraded from the quality of an image reconstructed from k-space data before reducing the bit length. However, for example, when investigating a cause of an artifact, the object of the investigation can be achieved even if the quality of an image is degraded more or less. Therefore, reduction in the bit length is an effective measure to reduce a data volume.

A third embodiment of the present invention is explained below in a case where a data volume of k-space data is reduced by reducing the bit length of k-space data.

A magnetic resonance imaging apparatus according to the third embodiment has the almost same configuration in total as that of the first embodiment, and only some of functional units included in a computer 300 according to the third embodiment are different from the computer 100. A configuration of a software program and operations to be executed by the computer 300 are explained below.

Figure 7:
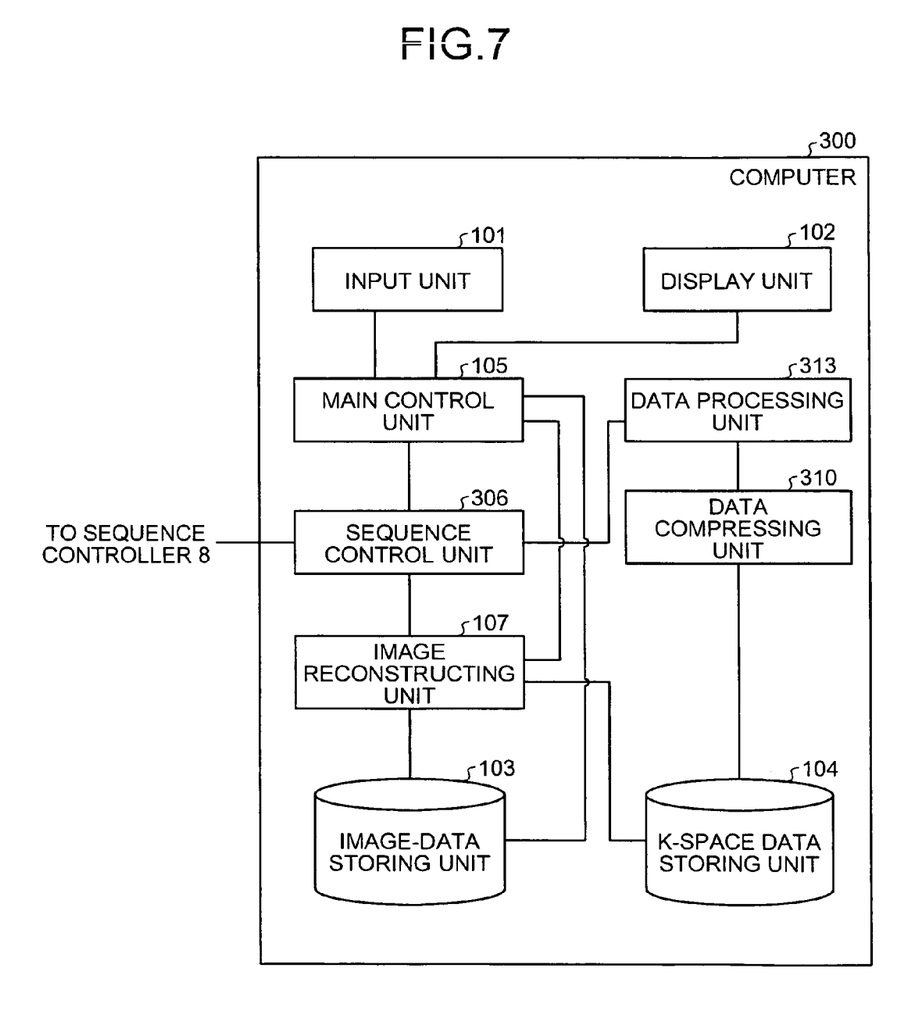
FIG. 7 is a functional block diagram of a computer according to a third embodiment of the present invention.

First of all, a configuration of a software program to be executed by the computer 300 is explained below. As shown in FIG. 7, the software program includes conceptual functional units, namely, the input unit 101, the display unit 102, the image-data storing unit 103, the k-space data storing unit 104, the main control unit 105, a sequence control unit 306, the image reconstructing unit 107, a data compressing unit 310, and a data processing unit 313.

For convenience of explanation, functional units that works similarly to respective units shown in FIG. 3 are assigned with the same reference numerals, detailed explanations of them are omitted, and only points different from the first embodiment are explained below.

As shown in FIG. 7, the software program to be executed by the computer 300 includes the data processing unit 313 instead of the processing-limited reconstructing unit 108 and the inverse reconstructing unit 109 in the configuration shown in FIG. 3.

When raw data is sent from the sequence controller 8, the sequence control unit 306 converts the sent raw data into k-space data, and sends the converted k-space data to the image reconstructing unit 107 and the data processing unit 313.

The data processing unit 313 reduces the bit length of each piece of the k-space data sent from the sequence control unit 106. Specifically, when the k-space data is sent from the sequence control unit 106, the data processing unit 313 reduces the bit length by deleting a predetermined number of bits from the top or the end of a piece of the k-space data.

After reducing the k-space data in bit length, the data processing unit 313 then sends the k-space data to the data compressing unit 310. The data compressing unit 310 compresses k-space data sent from the data processing unit 313 in accordance with a predetermined compression method, and stores the compressed k-space data into the k-space data storing unit 104.

Figure 8:
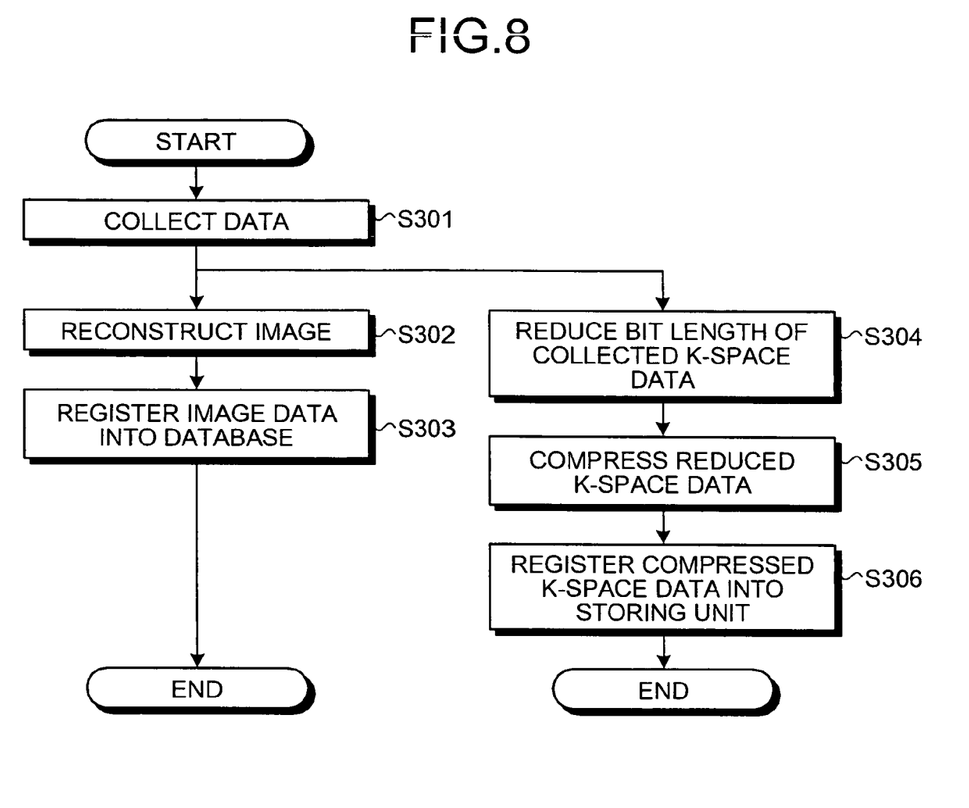
FIG. 8 is a flowchart of a processing procedure performed by the computer according to the third embodiment.

A processing procedure performed by the computer 300 is explained below. As shown in FIG. 8, to begin with, the computer 300 collects k-space data (Step S301). Specifically, the sequence control unit 306 receives raw data sent from the sequence controller 8, converts the raw data into k-space data, and sends the converted k-space data to the image reconstructing unit 107 and the data processing unit 313.

When receiving the k-space data, the image reconstructing unit 107 reconstructs image data by performing image reconstruction on the k-space data (Step S302). The image reconstructing unit 107 then stores the reconstructed image data into the image-data storing unit 103 (Step S303).

On the other hand, when receiving the k-space data, the data processing unit 313 reduces the bit length of the k-space data (Step S304). The data processing unit 313 then sends the k-space data of which bit length is reduced to the data compressing unit 310.

When receiving the k-space data, the data compressing unit 310 compresses the k-space data (Step S305), and stores the compressed k-space data into the k-space data storing unit 104 (Step S306).

Thus, according to the third embodiment, a required capacity of a storage medium for storing therein the k-space data collected from the object can be reduced.

Although the third embodiment is explained above in the case where the k-space data collected from the object is aggregated to one piece of k-space data, to achieve the object to reduce a required capacity of a storage medium for storing therein k-space data, the k-space data is not necessarily to be aggregated into one piece. In other words, at least if the number of k-space data after the inverse reconstruction is performed is fewer than the number of pieces of data when the data is collected from the object, the required capacity of a storage medium for storing therein k-space data can be reduced.

For example, it can be configured such that the image reconstructing unit 107 groups the k-space data collected from the object into a plurality of groups, and reconstructs image data with respect to each of the groups, the inverse reconstructing unit 109 then performs predetermined inverse reconstruction on the image data reconstructed by the image reconstructing unit 107, and creates synthetic k-space data that is synthesized from the k-space data with respect to each of the groups.

Figure 9:
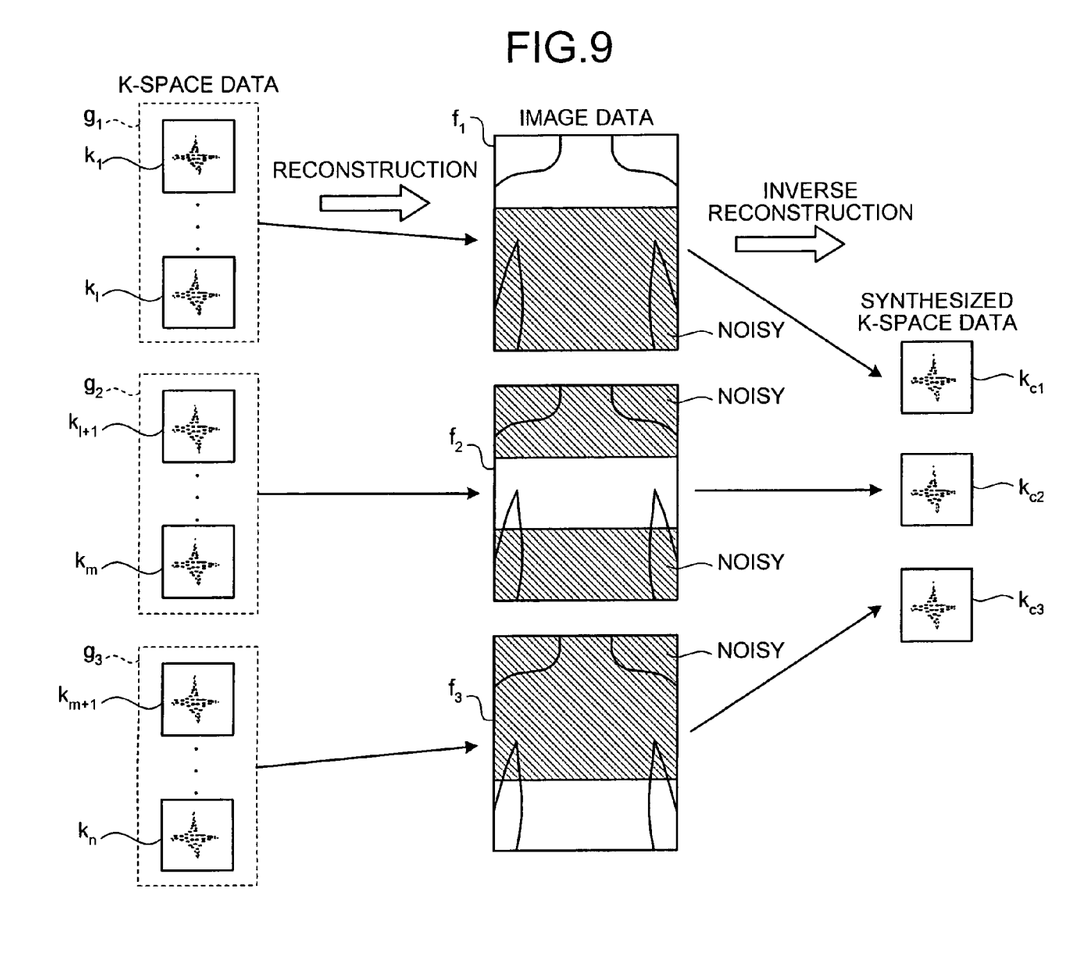
FIG. 9 is a schematic diagram for explaining a concept of storing data when grouping k-space data.

FIG. 9 depicts an example of scanning areas including from the neck to the stomach of the object, where k-space data $k_1$ to $k_l$ are k-space data received by a receiver coil positioned in the vicinity of the neck, k-space data $k_{l+1}$ to $k_m$ are k-space data received by a receiver coil positioned in the vicinity of the breast, and k-space data $k_{m+1}$ to $k_n$ are k-space data received by a receiver coil positioned in the vicinity of the shoulder.

In this case, for example, as shown in FIG. 9, the image reconstructing unit 107 groups the k-space data $k_1$ to $k_l$, $k_{l+1}$ to $k_m$, and $k_{m+1}$ to $k_n$, into groups $g_1$, $g_2$, and $g_3$, respectively, and reconstructs image data $f_1$, $f_2$, and $f_3$ from the k-space data of the groups $g_1$, $g_2$, and $g_3$, respectively.

The inverse reconstructing unit 109 then performs the predetermined inverse reconstruction on the image data $f_1$, $f_2$, and $f_3$, so that the inverse reconstructing unit 109 creates synthetic k-space data $k_{c1}$ to $k_{c3}$ that are synthesized from the k-space data with respect to each of the groups.

According to the example, the image data $f_1$, $f_2$, and $f_3$ reconstructed by the image reconstructing unit 107 are images created from scanning the same area. The image data $f_1$ has an excellent signal-noise (SN) ratio from the neck to the shoulder, and the rest of the portions, i.e., a shadow area shown in FIG. 9, include a lot of noises. The image data $f_2$ has an excellent SN ratio from the breast to the upper stomach, and the rest of the portions, i.e., a shadow area shown in FIG. 9, include a lot of noises. The image data $f_3$ has an excellent SN ratio at the lower stomach, and the rest of the portions, i.e., a shadow area shown in FIG. 9, include a lot of noises. For this reason, the k-space data $k_{c1}$ to $k_{c3}$ created by the inverse reconstructing unit 109 include images of respective different body parts each having an excellent SN ratio, and can be stored as k-space data divided with respect to each of the body parts.

In this way, for example, when using a plurality of array coils that includes an array coil for the stomach, an array coil for the spine, and the like, and can receive a magnetic resonance (MR) signal from a wide area, the image reconstructing unit 107 divides k-space data into groups of respective body parts by grouping channels of signals, such as a channel of signals to be received by a receiver coil positioned near the breast, and a channel of signals to be received by a receiver coil positioned near the stomach. Accordingly, when retrying reconstruction of image data, image data can be reconstructed by changing conditions for the filtering process and the absolutizing process to suitable conditions for respective body parts, so that the stored k-space data stored can be effectively used.

As the unit of a group for grouping k-space data, various units are conceivable.

For example, a 3-tesla MRI, which is recently under development, includes a plurality of transmitter coils for irradiating a RF wave in some cases. In such case, it can be configured such that the image reconstructing unit 107 groups the k-space data with respect to each of the transmitter coils by grouping channels of signals to be received by receiver coils positioned near transmitter coils into groups of the respective transmitter coils. Accordingly, an influence onto the image by the transmitter coils can be checked.

Alternatively, when scanning areas including an organ in motion, such as a heart or a lung, and an organ without motion, it can be configured such that the image reconstructing unit 107 divides k-space data into a group of the organ in motion and a group of the organ without motion, by separately grouping a channel of signals to be received by receiver coils positioned near the organ in motion, and a channel of signals to be received by receiver coils positioned near the organ without motion. Accordingly, k-space data collected from an area in which an artifact likely occurs due to motion can be stored separately from k-space data collected from another area in which an artifact unlikely occurs. When retrying image reconstruction, for example, if k-space data is collected from an area in which an artifact occurs, image data is reconstructed after performing processing to reduce an artifact on the k-space data, so that the k-space data can be efficiently used.

Thus, by aggregating k-space data with respect to each of predetermined groups, the number of k-space data after inverse reconstruction is less than the number of pieces of data collected from the object, as a result, a required capacity for storing therein k-space data can be reduced. The example shown in FIG. 9 is a case where k-space data is grouped into three groups as an example, however, the number of groups is not limited to this, but can be any number less than the number of the k-space data collected from the object.

The above embodiments are explained in the cases where one computer is used, however, the functional units explained above can be arranged in a plurality of computers in a distributed manner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
    a data collecting unit that collects a plurality of first k-space data from an object by using nuclear magnetic resonance phenomenon;
    an image reconstructing unit that reconstructs image data by performing a predetermined image reconstruction process including a data synthesizing process on the first k-space data collected by the data collecting unit;
    an inverse reconstructing unit that creates second k-space data synthesized from the first k-space data by performing a predetermined inverse reconstruction process on the image data reconstructed by the image reconstructing unit; and
    a converted-data storing unit that stores the second k-space data created by the inverse reconstructing unit into a storage medium.

2. The magnetic resonance imaging apparatus according to claim 1, further comprising a conversion-unneeded data specification receiving unit that receives a specification of image data unneeded to be inversely reconstructed by the inverse reconstructing unit from among the image data reconstructed from the first k-space data, wherein
    for the first k-space data that is a basis of the image data for which the specification is not received, the converted-data storing unit stores the second k-space data into the storage medium, and
    for the first k-space data that is a basis of the image data for which the specification is received, the converted-data storing unit stores the first k-space data into the storage medium.

3. The magnetic resonance imaging apparatus according to claim 1, wherein the image reconstructing unit excludes a filtering process and an absolutizing process from the predetermined image reconstruction process.

4. The magnetic resonance imaging apparatus according to claim 2, wherein the image reconstructing unit excludes a filtering process and an absolutizing process from the predetermined image reconstruction process.

5. The magnetic resonance imaging apparatus according to claim 1, wherein
    the image reconstructing unit reconstructs single image data from the first k-space data collected by the data collecting unit, and
    the inverse reconstructing unit creates single second k-space data synthesized from the first k-space data by performing the predetermined inverse reconstruction process on the image data reconstructed by the image reconstructing unit.

6. The magnetic resonance imaging apparatus according to claim 2, wherein
    the image reconstructing unit reconstructs single image data from the first k-space data collected by the data collecting unit, and
    the inverse reconstructing unit creates single second k-space data synthesized from the first k-space data by performing the predetermined inverse reconstruction process on the image data reconstructed by the image reconstructing unit.

7. The magnetic resonance imaging apparatus according to claim 3, wherein
the image reconstructing unit reconstructs single image data from the first k-space data collected by the data collecting unit, and
the inverse reconstructing unit creates single second k-space data synthesized from the first k-space data by performing the predetermined inverse reconstruction process on the image data reconstructed by the image reconstructing unit.

8. The magnetic resonance imaging apparatus according to claim 4, wherein
the image reconstructing unit reconstructs single image data from the first k-space data collected by the data collecting unit, and
the inverse reconstructing unit creates single second k-space data synthesized from the first k-space data by performing the predetermined inverse reconstruction process on the image data reconstructed by the image reconstructing unit.

9. The magnetic resonance imaging apparatus according to claim 1, wherein
the image reconstructing unit groups the first k-space data collected by the data collecting unit into a plurality of groups, and reconstructs the image data for each of the groups, and
the inverse reconstructing unit creates the second k-space data synthesized from the first k-space data for each of the groups by performing the predetermined inverse reconstruction on the image data reconstructed by the image reconstructing unit.

10. The magnetic resonance imaging apparatus according to claim 2, wherein
the image reconstructing unit groups the first k-space data collected by the data collecting unit into a plurality of groups, and reconstructs the image data for each of the groups, and
the inverse reconstructing unit creates the second k-space data synthesized from the first k-space data for each of the groups by performing the predetermined inverse reconstruction on the image data reconstructed by the image reconstructing unit.

11. The magnetic resonance imaging apparatus according to claim 3, wherein
the image reconstructing unit groups the first k-space data collected by the data collecting unit into a plurality of groups, and reconstructs the image data for each of the groups, and
the inverse reconstructing unit creates the second k-space data synthesized from the first k-space data for each of the groups by performing the predetermined inverse reconstruction on the image data reconstructed by the image reconstructing unit.

12. The magnetic resonance imaging apparatus according to claim 4, wherein
the image reconstructing unit groups the first k-space data collected by the data collecting unit into a plurality of groups, and reconstructs the image data for each of the groups, and
the inverse reconstructing unit creates the second k-space data synthesized from the first k-space data for each of the groups by performing the predetermined inverse reconstruction on the image data reconstructed by the image reconstructing unit.

13. The magnetic resonance imaging apparatus according to claim 1, wherein the converted-data storing unit stores the second k-space data into the storage medium after performing a predetermined data-compression process on the second k-space data.

14. The magnetic resonance imaging apparatus according to claim 2, wherein the converted-data storing unit stores the second k-space data into the storage medium after performing a predetermined data-compression process on the second k-space data.

15. The magnetic resonance imaging apparatus according to claim 3, wherein the converted-data storing unit stores the second k-space data into the storage medium after performing a predetermined data-compression process on the second k-space data.

16. The magnetic resonance imaging apparatus according to claim 4, wherein the converted-data storing unit stores the second k-space data into the storage medium after performing a predetermined data-compression process on the second k-space data.

17. The magnetic resonance imaging apparatus according to claim 5, wherein the converted-data storing unit stores the second k-space data into the storage medium after performing a predetermined data-compression process on the second k-space data.

18. The magnetic resonance imaging apparatus according to claim 6, wherein the converted-data storing unit stores the second k-space data into the storage medium after performing a predetermined data-compression process on the second k-space data.

19. The magnetic resonance imaging apparatus according to claim 9, wherein the converted-data storing unit stores the second k-space data into the storage medium after performing a predetermined data-compression process on the second k-space data.

20. The magnetic resonance imaging apparatus according to claim 10, wherein the converted-data storing unit stores the second k-space data into the storage medium after performing a predetermined data-compression process on the second k-space data.

21. A magnetic resonance imaging apparatus comprising:
a data collecting unit that collects a plurality of first k-space data from an object by using nuclear magnetic resonance phenomenon;
a bit-length reducing unit that reduces a bit length of each of the first k-space data collected by the data collecting unit, and outputs second k-space data with a reduced bit length; and
a converted-data storing unit that stores the second k-space data into a storage medium.

22. The magnetic resonance imaging apparatus according to claim 21, wherein the converted-data storing unit stores the second k-space data into the storage medium after performing a predetermined data-compression process on the second k-space data.

23. An image processing apparatus comprising:
a data acquiring unit that acquires a plurality of first k-space data collected from an object by using nuclear magnetic resonance phenomenon;
an image reconstructing unit that reconstructs image data by performing a predetermined image reconstruction process including a data synthesizing process on the first k-space data acquired by the data acquiring unit;
an inverse reconstructing unit that creates second k-space data synthesized from the first k-space data by performing a predetermined inverse reconstruction process on the image data reconstructed by the image reconstructing unit; and a converted-data storing unit that stores the second k-space data created by the inverse reconstructing unit into a storage medium.

24. A computer program product comprising a computer-usable medium having computer-readable program codes embodied in the medium that when executed cause a computer to execute:

acquiring a plurality of first k-space data collected from an object by using nuclear magnetic resonance phenomenon;

reconstructing image data by performing a predetermined image reconstruction process including a data synthesizing process on the first k-space data acquired at the acquiring;

creating second k-space data synthesized from the first k-space data by performing a predetermined inverse reconstruction process on the image data reconstructed at the reconstructing; and storing the second k-space data created at the creating into a storage medium.

25. A method of storing data, comprising:

acquiring a plurality of first k-space data collected from an object by using nuclear magnetic resonance phenomenon;

reconstructing image data by performing a predetermined image reconstruction process including a data synthesizing process on the first k-space data acquired at the acquiring;

creating second k-space data synthesized from the first k-space data by performing a predetermined inverse reconstruction process on the image data reconstructed at the reconstructing; and storing the second k-space data created at the creating into a storage medium.

* * * * *